United States Patent [19]

Ishigami et al.

[11] Patent Number: 4,513,339
[45] Date of Patent: Apr. 23, 1985

[54] CURRENT DETECTING APPARATUS

[75] Inventors: Yoshihisa Ishigami; Yasumasa Hashimota; Tadaharu Kitado; Hiromi Nishimura; Tetsuo Mori, all of Kadoma, Japan

[73] Assignee: Matsushita Electric Works, Ltd., Osaka, Japan

[21] Appl. No.: 527,224

[22] Filed: Aug. 29, 1983

[30] Foreign Application Priority Data

Sep. 10, 1982 [JP] Japan .............................. 57-158551

[51] Int. Cl.$^3$ .............................................. H02H 3/28
[52] U.S. Cl. ........................................ 361/45; 361/42; 361/87
[58] Field of Search ................... 361/42, 44, 45, 46, 361/87

[56] References Cited

U.S. PATENT DOCUMENTS

4,135,222 1/1979 Siepmann .......................... 361/45 X

Primary Examiner—Reinhard J. Eisenzopf
Assistant Examiner—Hong K. Choe
Attorney, Agent, or Firm—Burns, Doane, Swecker & Mathis

[57] ABSTRACT

A current detecting device includes high frequency oscillation detecting circuits which, when a saturable reactor oscillates at a high frequency, detect the high frequency oscillation of the reactor and generate a high level output. Thus, when a large current flows through the reactor and the magnetization characteristic of the reactor is varied to generate a normal detection output, the reactor oscillation due to the large current is detected and an operating circuit for driving an external device is energized.

7 Claims, 15 Drawing Figures

CURRENT DETECTING APPARATUS

This invention relates to a current detecting device which is attached to lines through which a current to be detected flows so that, when the current exceeds a predetermined value, an operating circuit is energized to actuate an external device.

In current detecting devices of the kind referred to, generally, the current to be detected of several amperes or higher causes the magnetization characteristic of a saturable reactor in the device to be varied from that for a very small current and the reactor oscillates at a high frequency. As a result, there has been a problem that, when the current is large, variation in the current and corresponding duty become non-linear and the operating circuit can no more be driven.

A primary object of the present invention is, therefore, to provide a current detecting device in which, even when a current to be detected is large, an actuation circuit for actuating an external device can be energized.

Another object of the present invention is to provide a current detecting device which is provided with high frequency oscillation detecting circuits for detecting the high frequency oscillation of the saturable reactor and operating the operating circuit capable of actuating the external device so that even a large current to be detected will result in a reliable energization of the operating circuit.

Other objects and advantages of the present invention shall become clear from following descriptions of certain preferred embodiments of the invention detailed with reference to accompanying drawings, in which:

FIGS. 2, 2A and 2B are circuit diagram of an embodiment of the current detecting device according to the present invention;

FIGS. 5, 5A AND 5B are circuit diagram of another embodiment of the current detecting device according to the present invention.

While the present invention shall be described with reference to the embodiments shown in the accompanying drawings, it should be understood that the invention is not limited only to the particular embodiments, but rather includes all other possible modifications, alterations and equivalent arrangements within the scope of appended claims.

Figure 1:
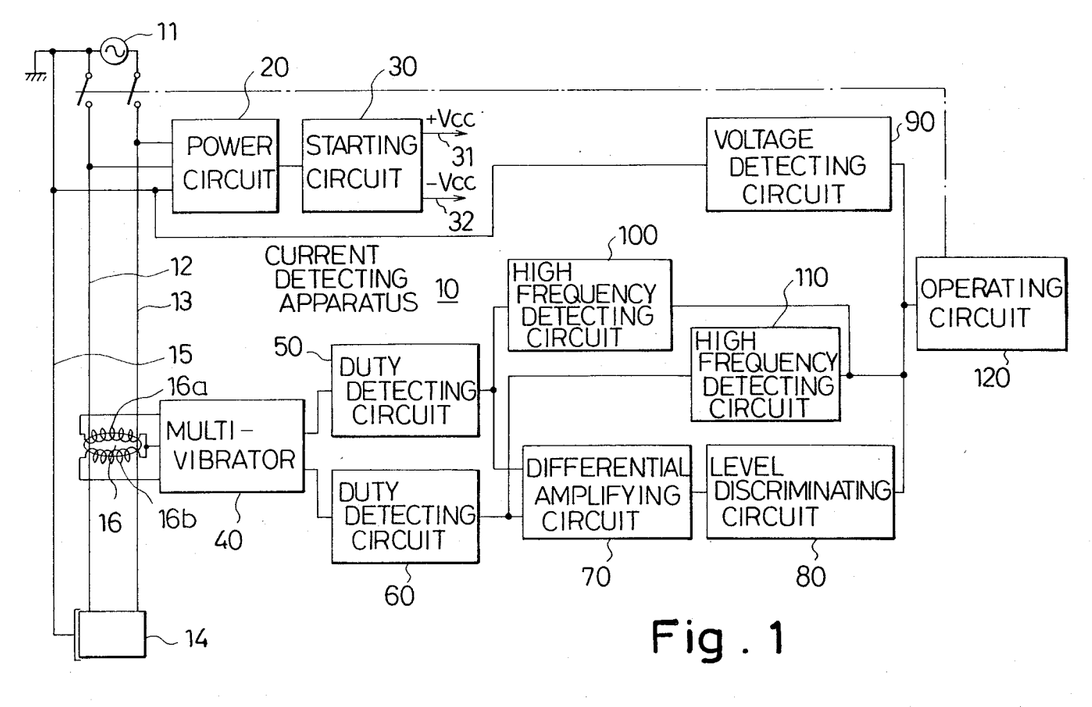
FIG. 1 is a block diagram of a current detecting device according to the present invention.

Referring to FIG. 1, electric power is supplied from an A.C. power source 11 through lines 12 and 13 to a load 14. Between the A.C. power source 11 and load 14 is connected by an earthed line 15. Any difference between a current $I_1$ flowing through the line 12 and a current $I_2$ flowing through the line 13, such as a D.C. or A.C. leakage current to be detected can be detected by a current detecting device 10 including a saturable reactor 16. The device 10 comprises a power supply circuit 20, a start circuit 30, a multivibrator circuit 40 connected directly to the saturable reactor 16, duty detecting circuits 50 and 60, a differential amplifier circuit 70, a level discriminating circuit 80, a voltage detecting circuit 90, high frequency oscillation detecting circuits 100 and 110, and an operating circuit 120.

The power supply circuit 20 is supplied with A.C. power via the lines 12 and 13 so that the A.C. power is converted to D.C. power and sent to the start circuit 30 in which the input D.C. power is made constant in voltage so that a constant positive D.C. voltage $+V_{cc}$ and a constant negative D.C. voltage $-V_{cc}$ are provided onto lines 31 and 32 respectively and applied to the multivibrator circuit 40, duty detecting circuits 50 and 60, differential amplifier circuit 70, level discriminating circuit 80, voltage detecting circuit 90 and high frequency oscillation detecting circuits 100 and 110.

On the other hand, the multivibrator circuit 40 which is connected to secondary and tertiary windings 16a and 16b of the saturable reactor 16, always oscillates at a period T determined by $T = 4 \cdot n \cdot \phi_m / E_c$, where n is winding number of the respective secondary and tertiary windings, $E_c$ is a voltage applied to the secondary and tertiary windings and $\phi_m$ is the saturation magnetic flux of the saturable reactor 16, whereby two outputs which are the same in peak value and waveform are sequentially provided from the multivibrator circuit 40 to the duty detecting circuits 50 and 60, respectively, and the duty detecting circuits 50 and 60 respectively provide outputs of mutually opposite phase which are applied to the differential amplifier 70 to be differentially amplified therein. The differentially amplified output is applied to the level discriminating circuit 80 as its input and, when the input exceeds a predetermined discrimination level, the circuit 80 provides an output for energizing the operating circuit 120.

Further, the voltage detecting circuit 90 is connected to the A.C. power source through the earthed line 15 and a resistor having a properly large resistance value so that, when the power feeding line 12 or 13 is in any faulty condition, the circuit 90 detects and amplifies a slight voltage occurring in the line so as to energize the operating circuit 120.

On the other hand, the respective outputs of the duty detecting circuits 50 and 60 are also sent to the high frequency oscillation detecting circuits 100 and 110 so that, if a large leakage current of, for example, several amperes takes place in the power feeding line 12 or 13 and the saturable reactor 16 oscillates at a high frequency due to variation in its magnetization characteristic, then the high frequency detecting circuits 100 and 110 detect the high frequency oscillation and energize the operating circuit 120.

Figure 2A:
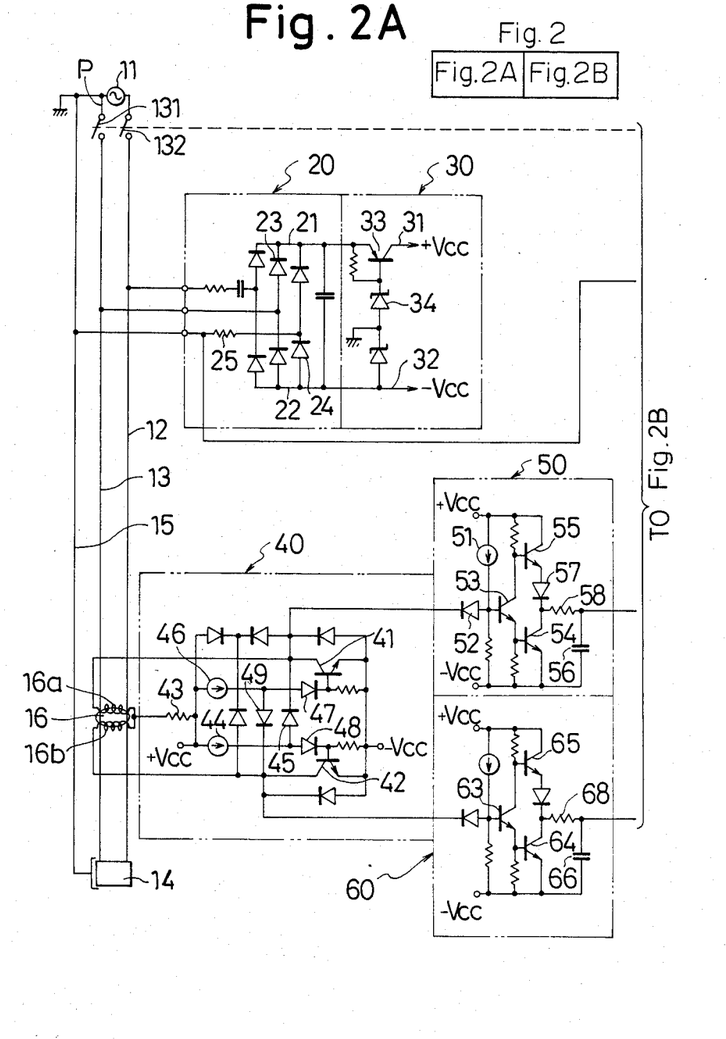
Figure 2B:
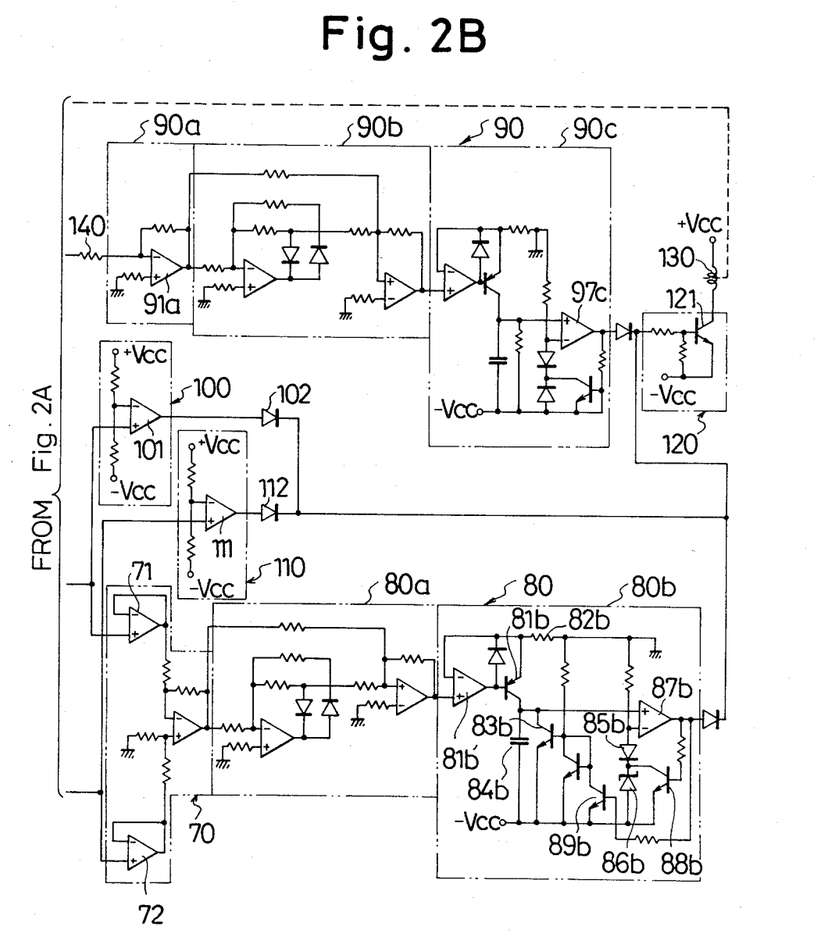

The operation of the current detecting device 10 according to the present invention shall further be detailed with reference to FIGS. 2A and 2B showing a practical circuit arrangement of the device. Now, when contacts 131 and 132 of a relay 130 connected to the power feeding lines 12 and 13 and forming in the present instance an external device of the operating circuit are manually closed, a transistor 33 in the start circuit 30 is turned OFF. The impedance of respective elements connected between lines 21 and 22 in the power supply circuit 20 is large and thus a voltage developed between the lines 21 and 22 becomes abruptly large. When a voltage between the line 21 and the ground exceeds the Zener voltage of a Zener diode 34 in the start circuit 30, the transistor 33 is conducted and the voltage generated between the lines 21 and 22 becomes small, whereby the D.C. voltages are abruptly applied to the respective parts of the current detecting device as has been partly referred to and the overall current detecting device is caused to be operated in a very short time.

So long as the contacts 131 and 132 are closed and there is no abnormality such as a leak in the load circuit, a current detected by the saturable reactor 16 is zero and an output provided from the level discriminating circuit 80, voltage detecting ciucuit 90 or high frequency oscillation detecting circuits 100 and 110 for directly energizing the operating circuit 120 will be at low level, and the operating circuit 120 is not energized.

Figure 3A:
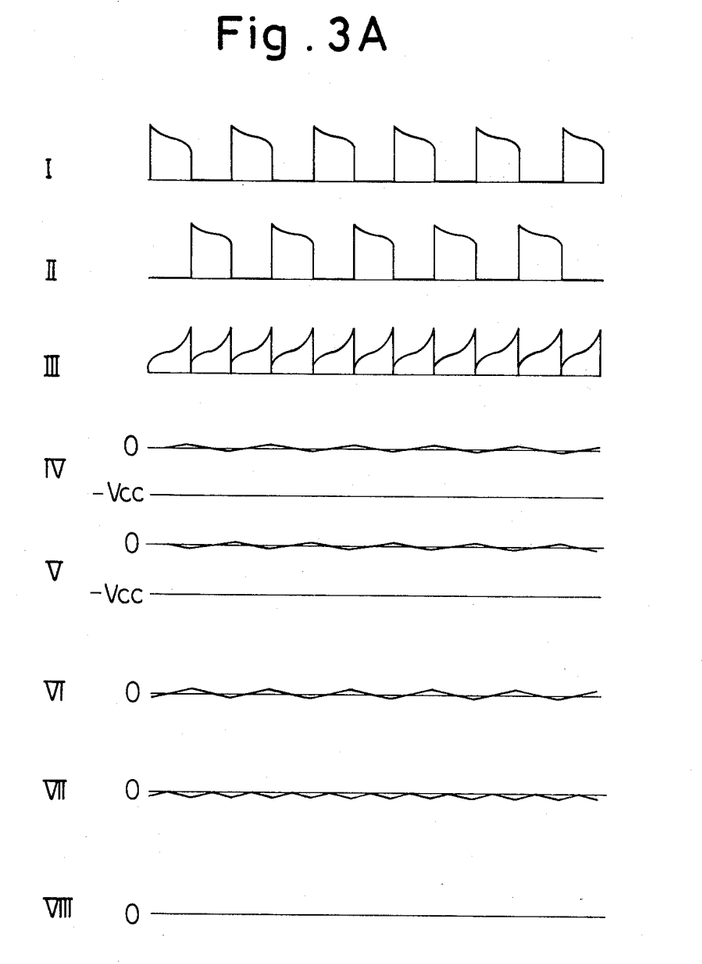
FIGS. 3A to 3E show waveforms appearing at various points in the circuit of FIG. 2, respectively in different operational states.

The normal operation of the current detecting device according to the present invention shall be further detailed additionally referring to FIG. 3A. When currents flowing through the lines 12 and 13 are in a balanced relation, voltages induced in the secondary and tertiary windings of the saturable reactor 16 are both zero. Even in this instance, however, the multivibrator circuit 40 oscillates at the foregoing oscillation period T and transistors 41 and 42 in the circuit 40 are repetitively turned ON and OFF at a duty ratio of 50% within the oscillation period T. When the transistor 41 is ON and the transistor 42 is OFF in the multivibrator circuit 40, a current flows through the secondary winding 16a of the reactor 16 and a resistance 43. At initial stage of the turning ON of the transistor 41, a constant current is supplied to the transistor 41 from a current generator 44 through a diode 45 and from a current generator 46 through a diode 47, respectively, because the base voltage of the transistor 41 is low. When the base voltage exceeds a predetermined level, the transistor 41 shifts into its active zone. A voltage between the collector and emitter of the transistor 41 is shown as "I" in FIG. 3A.

When, on the other hand, the base voltage of the transistor 41 becomes sufficiently high, a constant current is supplied to the transistor 42 from the current generator 44 through a diode 48 and from the current generator 46 through a diode 49, whereby the transistor 42 is turned ON and the transistor 41 is turned OFF. Upon this conduction of the transistor 42, a current flows into the transistor 42 through the tertiary winding 16b of the reactor 16 and the resistance 43. A voltage between the collector and emitter of the transistor 42 is shown as "II" in FIG. 3A, and variation in a voltage applied across the resistance 43 when the transistors 41 and 42 are repetitively turned ON and OFF are shown as "III" in FIG. 3A. As will be clear from the drawing, the collector-emitter voltages of the transistors 41 and 42 and the voltage applied across the resistance 43 are made constant in their peak value and, therefore, the two outputs of the same peak value and waveform can be provided sequentially from the multivibrator circuit 40.

Further in the multivibrator circuit 40, when constant currents considerably larger than a normal level are supplied from the current generators 44 and 46, the collector-emitter voltage of the transistors 41 and 42 becomes $2 \cdot V_{cc}/R_{43}$, where $R_{43}$ is the value of the resistance 43. That is, when the transistors 41 and 42 are shifted to their active zone, the transistors are abruptly turned OFF with their different duty cycles, and the oscillation is positively maintained. Therefore, even if an error occurs in the forward voltages of the diodes 45, 47, 48 and 49, the collector-emitter voltages of the transistors 41 and 42 and the voltage applied across the resistance 43 are kept constant in their peak value and the two outputs always of the same peak value and waveform are sequentially generated from the multivibrator.

In one 50 of the duty circuits receiving one of the two outputs of the multivibrator circuit 40, the transistor 41 made ON causes a current to flow to the transistor 41 from a current generator 51 through a diode 52, in which event transistors 53 and 54 are turned OFF and a transistor 55 is turned ON, whereby a capacitor 56 is charged through the transistor 55, a diode 57 and resistance 58. When the transistor 41 is non-conductive, on the other hand, no current flows through the diode 42 and the base voltage of the transistor 53 becomes high. This causes the transistor 53 to be turned ON and correspondingly the transistor 54 to be turned ON. At this point, the transistor 55 is turned OFF so that the capacitor 56 is discharged through the resistance 58 and transistor 54. The charging and discharging voltage of the capacitor 56 is shown as "IV" in FIG. 3A. The other duty circuit 60 operates in the similar manner to the duty circuit 50 in response to the ON and OFF operations of the transistor 42 in the multivibrator 40, and the charging and discharging voltage of the capacitor 66 in this event is shown as "V" in FIG. 3A.

In this case, since the resistance 58 and capacitor 56 receive a totem pole output corresponding to the duty from the multivibrator circuit 40 and the time constants for the charging and discharging are made to be equal to each other, the capacitor charging voltage shifts up and down with zero level V intermediate between the D.C. voltages $+V_{cc}$ and $-V_{cc}$ as a reference. Similarly, since a resistance 68 and capacitor 66 in the other duty detecting circuit 60 receive also the totem pole output and the time constants for charging and discharging are made to be equal to each other, the capacitor charging voltage shifts up and down with the zero level V between the D.C. voltages $+V_{cc}$ and $-V_{cc}$ as a reference. Consequently, the outputs of the duty detecting circuits 50 and 60 have the same reference voltage, whereby it is made unnecessary to set different reference voltages for the duty circuits 50 and 60 by any other means nor to perform any inter-adjustment between these circuits 50 and 60.

In the differential amplifier circuit 70 receiving the outputs of the duty detecting circuits 50 and 60, these outputs having mutually opposite phases are differentially amplified by operational amplifiers 71 and 72, in which case the detection sensitivity in the amplifier circuit 70 is doubled because the outputs of the duty detecting circuits are in a mutually opposite phase relation. The output of the amplifier circuit 70 is illustrated as "VI" in FIG. 3A. The discrimination circuit 80 receiving the output of the operational amplifier circuit 70 comprises a full-wave rectification circuit 80a and a time delay circuit 80b. The full-wave rectification circuit 80a integrates A.C. components in the output of the amplifier circuit and generates such an output as "VII" in FIG. 3A. In the time delay circuit 80b, a current flows through a resistance 82b so that an emitter voltage of a transistor 81b will be the one depending on the output from the full-wave rectification circuit 80a. At this time, a transistor 83b is conductive and a current flowing through the transistor 83b is used as a leak sensitivity reference current. Therefore, a current flowing through a capacitor 84b is equivalent to the leak current and determines a time W during which the relay 130 is energized by the operating circuit 120. When currents flowing through the lines 12 and 13 are in a balanced relation, that is, they are normal, the current flowing through the transistor 83b is larger than the current flowing through the capacitor 84b so that the charging voltage of the capacitor 84b is zero, thus the potential being $-V_{cc}$, as shown by "VIII" in FIG. 3A. A sum of the forward voltage of a diode 85b and the Zener voltage of a Zener diode 86b will be a first discrimination level and the forward voltage of the diode 85b alone will be a second discrimination level which is lower than the first discrimination level. If an electric leak occurs in the line 12 or 13, then the charging voltage of the capacitor 84b exceeds the first discrimination level, whereby the output of an operational amplifier 87b becomes a high level, the potential being $+V_{cc}$. When the output of the operational amplifier 87b is shifted to its high level, a transistor 88b is conducted and the operational amplifier 87b performs its discriminating function according to the second discrimination level. As a result, even if the voltage across the capacitor 84b is decreased, the discrimination level is correspondingly reduced and thus such a distorted A.C. leakage current as a phase control signal can be also well detected.

When the output of the operational amplifier 87b is shifted to its high level, a transistor 89b is turned ON while the transistor 83b is turned OFF, so that the current to the transistor 83b will not flow therethrough but the capacitor 84b will be charged by the amount of this current, whereby any distorted leakage current can be sufficiently detected even with this arrangement.

Figure 3B:
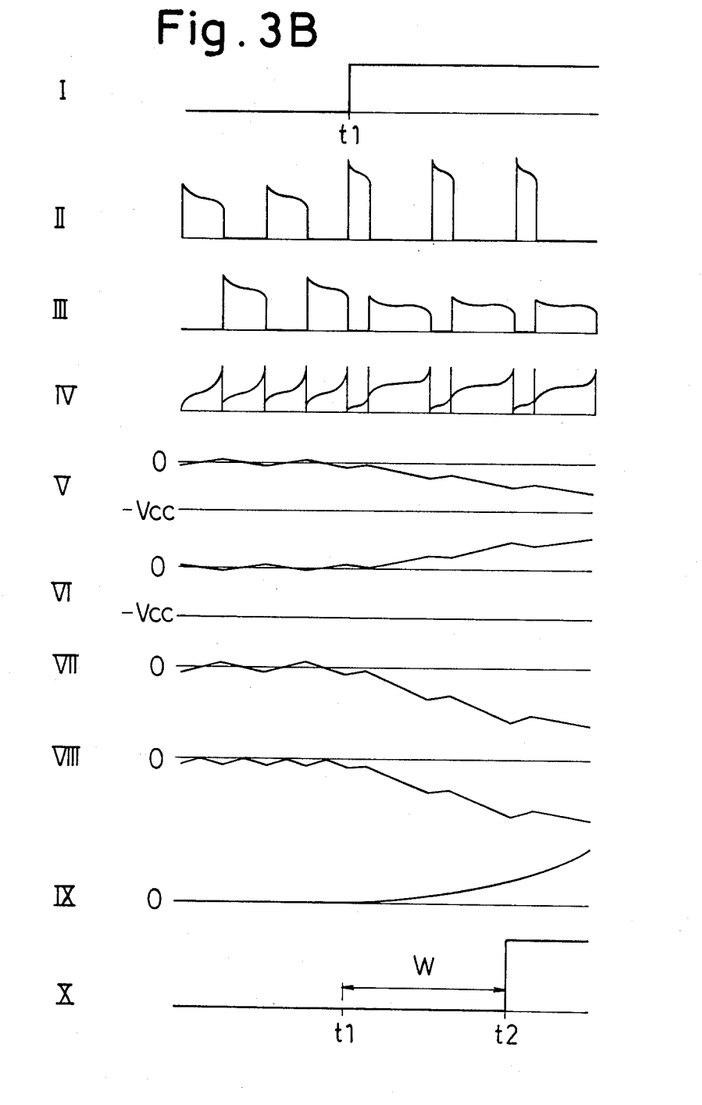

Next, references shall be made to the case where a D.C. leakage current is detected through the saturable reactor 16, with reference to FIG. 3B. When such a D.C. leakage current as shown by "I" in FIG. 3B is detected at a time t1, the collector-emitter voltages of the transistors 41 and 42 and the voltage applied to the resistance 43 vary as shown by "II", "III" and "IV" in FIG. 3B, respectively, whereby the duty ratios for the transistors 41 and 42 are caused to vary from 50% and this variation is detected by the duty detecting circuits 50 and 60. It will be appreciated by those skilled in the art that the output voltages of the duly detecting circuits 50 and 60 will then be as shown by "V" and "VI" in FIG. 3B and the output voltage of the differential amplifier circuit 70 will be as shown by "VII" in FIG. 3B, and thus the output voltage of the full-wave rectification circuit 80a becomes as shown by "VIII" in FIG. 3B. Further, an operational amplifier 81b' in the time delay circuit 80b generates an output signal so as to render the emitter voltage of the transistor 81b to be equal to the output voltage of the full-wave rectification circuit 80a, whereby the voltage across the capacitor 84b is gradually increased as shown by "IX" in FIG. 3B. When the voltage across the capacitor 84b exceeds the first discrimination level at a time t2 after the time period W, the output of the operational amplifier 87b is shifted to its high level and a transistor 121 in the actuation circuit 120 is turned ON so that a coil in the relay 130 is excited at the time t2 as shown by "X" in FIG. 3B and the relay switches 131 and 132 are turned OFF to open the load circuit.

Figure 3C:
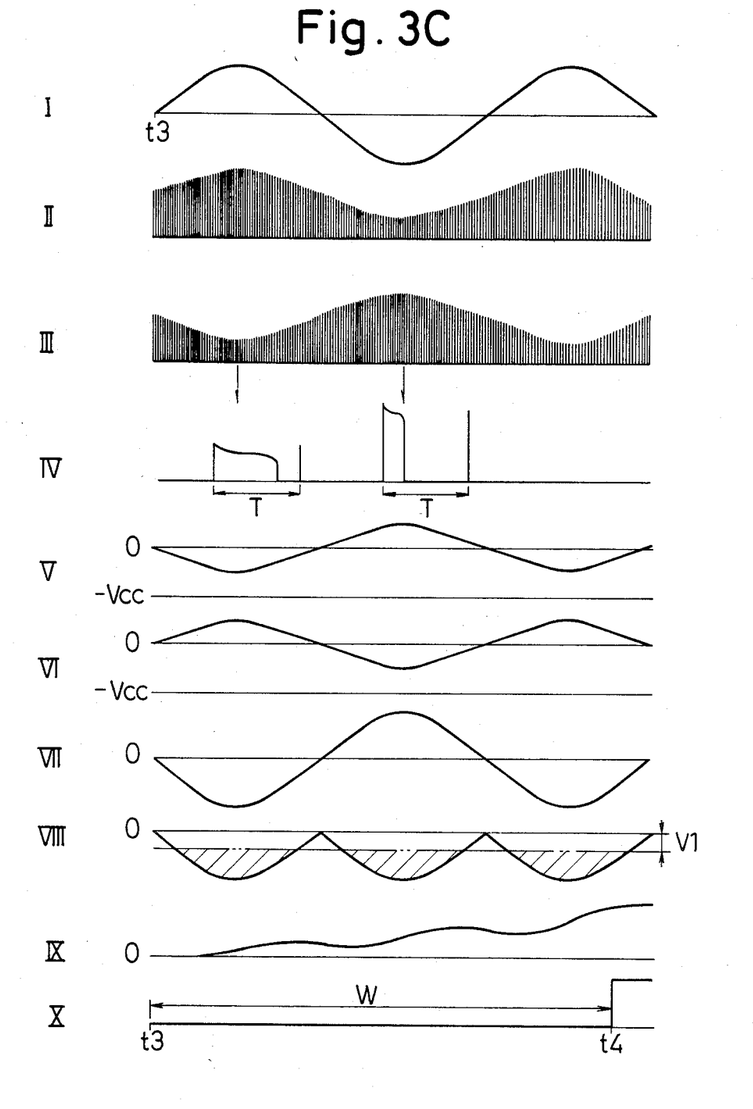

Referring next to FIG. 3C, the case where an A.C. leakage current is detected by the reactor 16 shall be explained. When such an A.C. leakage current as shown by "I" in FIG. 3C is detected at a time t3, the collector-emitter voltages of the transistors 41 and 42 in the multivibrator 40 will be shown by "II" and "III" in FIG. 3C. Portions in the voltage III denoted by arrows are shown as enlarged by "IV" in FIG. 3C. The duty ratios of the transistors 41 and 42 vary from 50% depending on the value of the leakage current and their variation is detected by the duty detecting circuits. Respective outputs of the duty detecting circuits 50 and 60 and differential amplifier 70 are as shown by "V", "VI" and "VII", while the output voltage of the full-wave rectification circuit 80a in the level discriminating circuit 80 is as shown by "VIII" in FIG. 3C. In the waveform VIII, a voltage V1 indicative of a gap between the zero volt level and a chain line corresponds to the discharging voltage of the capacitor 84b and hatched zones correspond to the charging voltage of the capacitor 84b. The operational amplifier 81b' provides an output so as to render the emitter voltage of the transistor 81b to be equal to the output voltage of the full-wave rectification circuit 80a. Therefore, the voltage across the capacitor 84b is gradually increased as shown by "IX" in FIG. 3C and, when the capacitor voltage exceeds the first discrimination level at a time t4 after the time period W, the output of the operational amplifier 87b is shifted to its high level. This causes the transistor 121 in the operating circuit 120 to be turned ON and the relay 130 energized to open the load circuit.

Figure 3D:
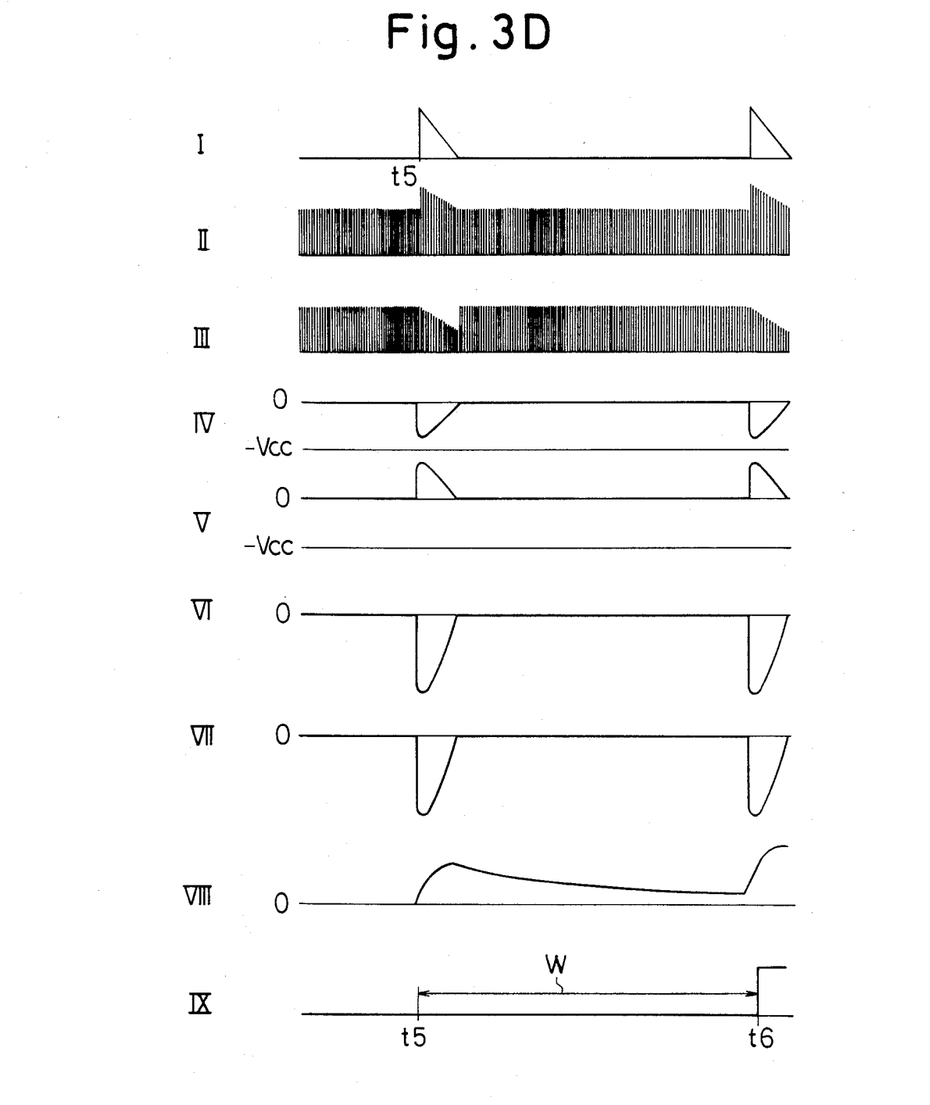

Further, when such a distorted A.C. leak current as shown by "I" in FIG. 3D is detected at a time t5 as phase-angle controlled, the collector-emitter voltages of the transistors 41 and 42 in the vibrator 40 will be as shown by "II" and "III" in FIG. 3D. The duty ratios of the transistors 41 and 42 vary from 50% depending on the value of the leakage current and their variation is detected by the duty detecting circuits. Respective output voltages of the duty detecting circuits 50 and 60 and differential amplifier 70 are as illustrated by "IV", "V" and "VI" in FIG. 3D, respectively, and the output voltage of the full-wave rectification circuit 80a in the level discrimination circuit 80 is as illustrated by "VII" in FIG. 3D and the voltage across the capacitor 84b is gradually increased as shown by "VIII". When the capacitor voltage exceeds the first discrimination level at a time t6 in a waveform IX, the operating circuit 120 is actuated and the relay 130 is energized.

References shall be made to the case where the line 12 is broken at a position P. In this case, a current which has so far flowed into the load 14 from the A.C. power source 11 through the line 13 is returned from the load to the A.C. power source 11 through the line 12, diode 23 in the power supply circuit 20, line 31 in the start circuit 30, load inserted between the lines 31 and 32, line 32, diode 24, resistance 25 and line 15. Therefore, currents flowing in the lines 12 and 13 at the saturable reactor 16 are balanced and thus the operating circuit 120 will not be energized a circuit including the reactor 16. On the other hand, A.C. power between the lines 13 and 15 is converted to D.C. power in the power supply circuit 20. Under this condition, such a slight current as to be 100 µA flows through a resistance 140 (FIG. 2B) inserted between the voltage detecting circuit 90 and the line connecting the power supply circuit 20 to the line 15 so as to render a current supplied to an inverse input of an operational amplifier 91a in the voltage detecting circuit 90 to be equal to a current supplied to a non-inverse input of the amplifier 91a.

The voltage detecting circuit 90 comprises a voltage amplifying circuit 90a including the operational amplifier 91a, a full-wave rectification circuit 90b and a time delay circuit 90c. The operational amplifier 91a amplifies the slight current provided thereto through the resistance 140 and sends amplified output to the full-wave rectification circuit 90b. The operations of the full-wave rectification circuit 90b and time delay circuit 90c are the same as those of the full-wave rectification circuit 80a and time delay circuit 80b in the level discriminating circuit 80. Therefore, the output of the operational amplifier 97c in the time delay circuit 90c is at high level so that the transistor 121 in the operating circuit 120 is ON and the relay 130 is energized.

Figure 3E:
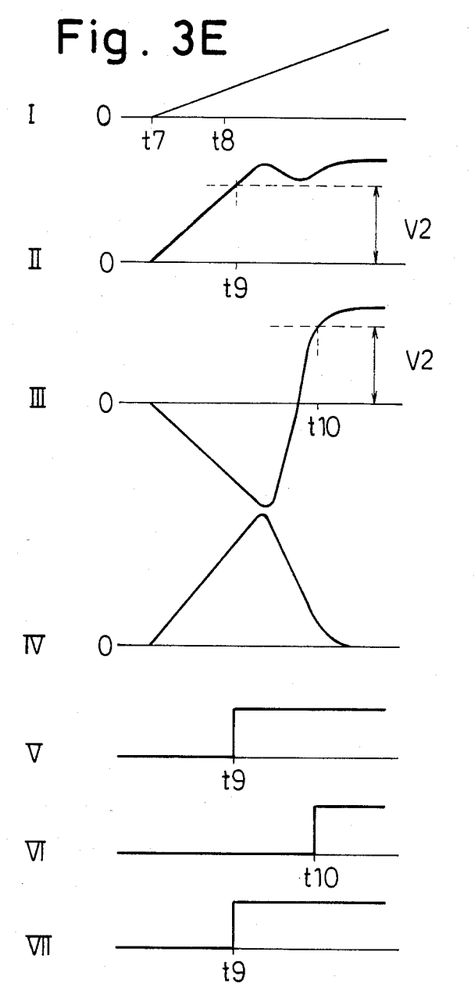
Figure 4A:
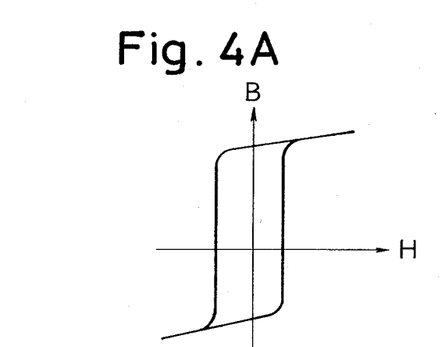
FIGS. 4A and 4B show different magnetization characteristics of a saturable reactor included in the current detecting device.
Figure 4B:
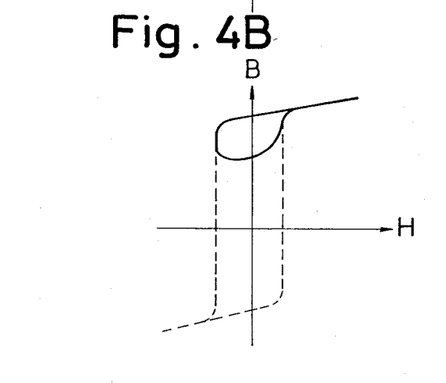

In addition, references shall be made to the case where a large D.C. leakage current takes place referring to FIG. 3E. When such a leakage current as shown by "I" in FIG. 3E is detected at a time t7, the saturable reactor 16 shows such a magnetization characteristic of a hysteresis curve as shown in FIG. 4A at the constant period T, as long as the leakage current is relatively weak during a term, for example, from the time t7 to a time t8. When the time t8 is reached and the leakage current becomes as large as, for example, several amperes, the magnetization characteristic of the reactor 16 is changed to the one having a period shorter than the period T as shown in FIG. 4B, and the reactor 16 oscillates at a high frequency. This high frequency oscillation results in that the duty variation responsive to the leakage current, i.e., the current to be detected becomes non-linear. In the zone of the leakage current after the time t8 in which the multivibrator 40 oscillates at a high frequency, the transistors 41 and 42 in the multivibrator 40 are substantially ON and the transistors 53 and 54 in the duty detecting circuit 50 are substantially OFF while the transistor 55 is substantially ON. As a result, the capacitor 56 which has been charged linearly in proportion to the still smaller leakage current until the time t8 is caused to be charged non-linearly after a time t9 as shown by "II" in FIG. 3E.

Transistors 63 and 64 in the duty circuit 60 are also substantially turned OFF and a transistor 65 is substantially turned ON so that the capacitor 66 which has been discharged linearly in proportion to the smaller leakage current stops its discharging before a time t10 and starts its charging as shown by "III" in FIG. 3E. The capacitors 56 and 66 reach a predetermined charging voltage substantially at the same time, and the output of the differential amplifier 70 becomes zero rapidly as shown by "IV" in FIG. 3E. As a result, the operating circuit 120 will not be energized by the differential amplifying circuit 70 and level discriminating circuit 80.

In the present embodiment, the outputs of the duty detecting circuits 50 and 60 are also sent to the high frequency oscillation detecting circuits 100 and 110, respectively. That is, at the time t9 when the level of a signal provided from the duty detecting circuit 50 to a non-inverse input of an operational amplifier 101 in the high frequency oscillation detecting circuit 100 exceeds a reference level V2 of an inverse input of the amplifier 101, the output of the operational amplifier 101 is shifted to high level as shown by "V" in FIG. 3E. When the output of the operational amplifier 101 is shifted to high level, the amplifier output is provided to the operating circuit 120 through a diode 102 so that the transistor 121 in the circuit 120 is turned ON and the relay 130 is excited, whereby the switches 131 and 132 are opened.

Also, at the time t10 when the level of a signal provided from the duty detecting circuit 60 to a non-inverse input of an operational amplifier 111 in the high frequency oscillation detecting circuit 110 exceeds the reference level V2 of an inverse input of the amplifier 111, the output of the amplifier 111 is shifted to high level as shown by "VI" in FIG. 3E. When the output of the amplifier 111 is shifted to high level, this output is provided to the operating circuit 120 through a diode 112. While this amplifier output to the operating circuit 120 is unnecessary because the output of the high frequency oscillation detecting circuit 100 is being provided to the operating circuit, the amplifier output is effectively used when the output of the high frequency oscillation detecting circuit 110 is insufficient.

Even when such a distorted A.C. leakage current as a phase control signal or a large A.C. leakage current takes place, the saturable reactor 16 oscillates at a high frequency and the outputs of the high frequency oscillation detecting circuits 100 and 110 are shifted to high level so that the operating circuit 120 will be thereby energized, as in the case of the large D.C. leakage current referred to above.

Figure 5A:
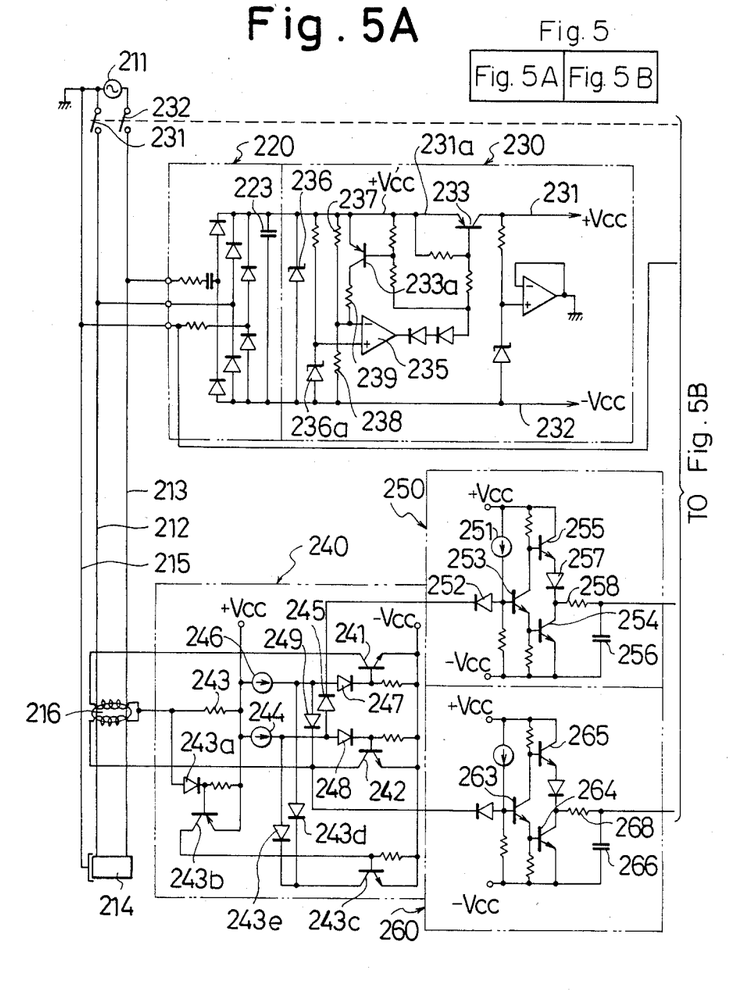
Figure 5B:
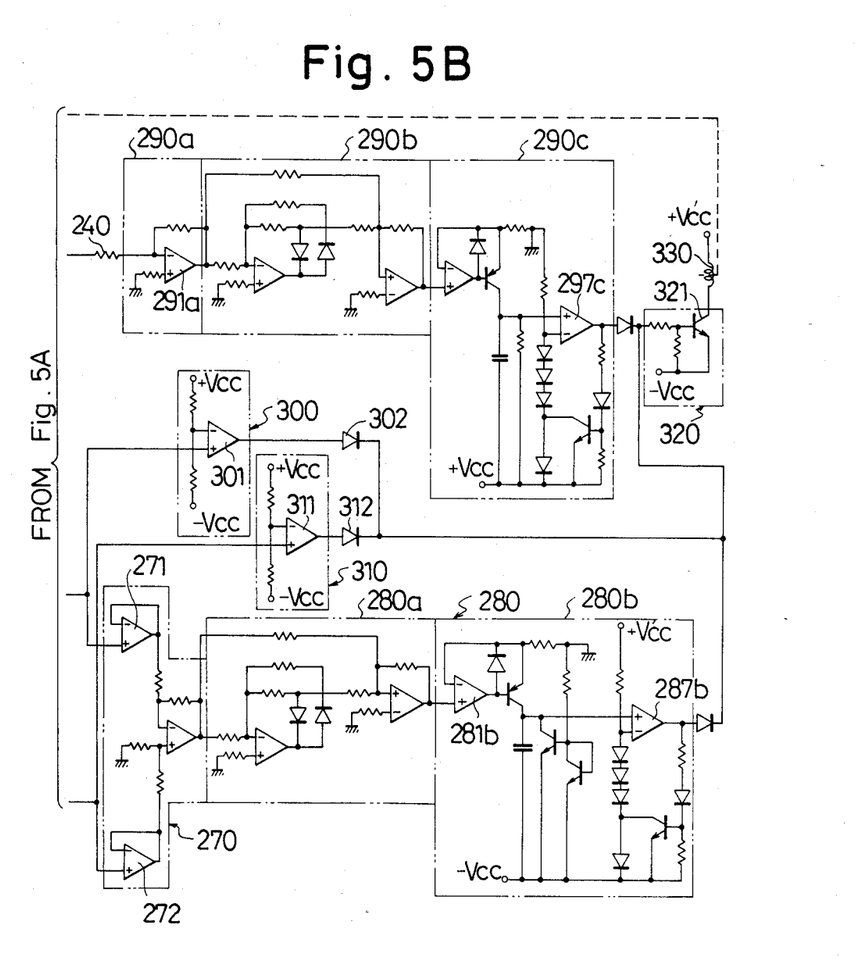

In FIGS. 5A and 5B, there is shown a practical circuit arrangement in another embodiment of the current detecting device according to the present invention, wherein components corresponding to those in FIGS. 2A and 2B are denoted by the same reference numerals but as added by 200. It will be readily understood by those skilled in the art that various sections in the circuit of FIGS. 5A and 5B are made preciser in their operating characteristic. More specifically, when A.C. power is fed to a power supply circuit 220, transistors 233 and 233a in a start circuit 230 are turned OFF, so that a D.C. voltage between lines 231a and 232 is abruptly raised and the D.C. voltages $+V'_{cc}$ and $-V_{cc}$ on lines 231a and 232 are applied to an operational amplifier 235, operating circuit 320 and time delay circuit 280b in a level discriminating circuit 280. A Zener diode 236 functions to prevent a capacitor 223 from being subjected to an abnormally high voltage. Further, the values of resistances 237, 238 and 239 are set to be the same, for example, to be 50KΩ. Under this condition, if the voltage between the lines 231a and 232 exceeds the Zener voltage of a Zener diode 236a, this diode 236a is turned ON and the output of an operational amplifier 235 is shifted from high level to low level.

When the output of the amplifier 235 is shifted to low level, the transistors 233 and 233a are turned ON so that the D.C. voltages $+V_{cc}$ and $-V_{cc}$ are abruptly sent from the lines 231 and 232. Further, since the transistor 233a is turned ON, the resistance 239 is caused to be connected in parallel with the resistance 237 and the voltage between the lines 231a and 232 are divided by the resistances 237, 238 and 239 and the reference voltage provided to an inverse input of the operational amplifier 235 is raised. Accordingly, it becomes difficult for the output of the amplifier 235 to shift from low level to high level. At this time, the start circuit 230 sends a D.C. voltage appearing between the lines 231a and 232 and does not send any voltage lower than the voltage between the lines 231a and 232. For this reason, even when the voltage of the A.C. power source fluctuates or even after the A.C. power has been cut off, the current detecting device can be sufficiently activated.

In a multivibrator circuit 240, on the other hand, a voltage across a resistance 243 made, so long as the same is low, not to exceed the Zener voltage of a Zener diode 243a and thus transistors 243b and 243c remain non-conductive so that a current from a current generator 246 flows through a diode 247 or 249 and does not flow through a diode 243d. Further, a current from a current generator 244 flows through a diode 248 or 245 and does not flow through a diode 243e. On the other hand, if a saturable reactor 216 is saturated so that the voltage across the resistance 243 increases and exceeds the Zener voltage of the Zener diode 243a, then the Zener diode 243a is turned ON and the transistors 243b and 243c are made to be turned ON. The currents from the current generators 246 and 244 do not flow through the diodes 247, 249 and 248, 245 but flow all through the diodes 243d and 243e, respectively, whereby transistors 241 and 242 one of which has been ON are both turned OFF. As a result, the outputs of the transistors 241 and 242 are made equal to each other in their voltage peak value.

Figure 6:
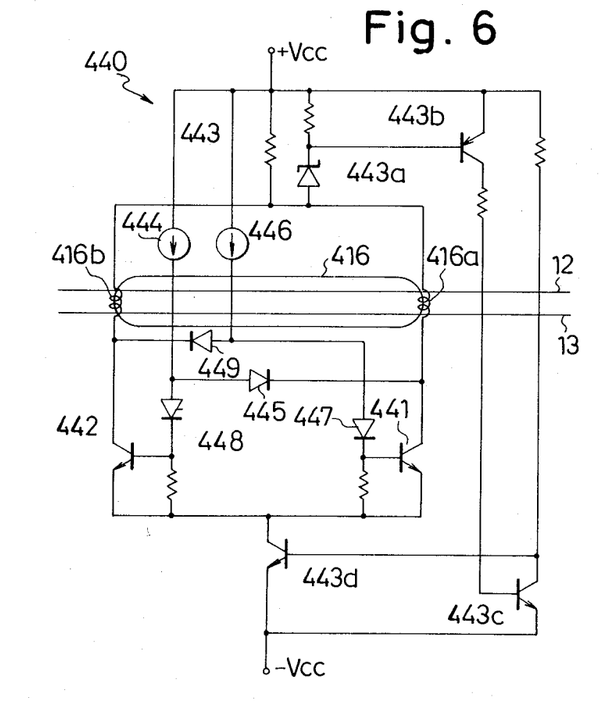
FIG. 6 is a partial circuit diagram of a further embodiment.

FIG. 6 shows another example of the vibrator circuit which can be employed in the current detecting device according to the present invention, wherein respective components corresponding to those in FIG. 2A are denoted by the same reference numerals but as added by 400. In the circuit of this example, a voltage across a resistance 443 keeps, while being low, a Zener diode 443a turned OFF and transistors 443b and 443c also turned OFF while a transistor 443d is made to be ON. A current from a current generator 446 flows through a diode 447 or 449 and a current from a current generator 444 flows through a diode 445, whereby either one of transistors 441 and 442 is turned ON. If a voltage across the resistance 443 increases and exceeds the Zener voltage of the Zener diode 443a, then the diode 443a is turned ON and the transistors 443b and 443c are also turned ON, while the transistor 443d is turned OFF, so that the transistors 441 and 442 either one of which has been turned ON are both turned OFF and the voltage peak values of the transistors 441 and 442 can be made equal to each other.

According to the current detecting device of the present invention arranged as has been described above, especially the oscillation detecting circuits for detecting the high frequency oscillation of the saturable reactor are provided in the device as so arranged that the operating circuit will be energized by these detecting circuits, and even a large current to be detected can effectively reliably have the operating circuit actuated.

What is claimed as our invention is:

1. A current detecting device comprising a power circuit providing a D.C. power to respective parts of said device, an operating circuit for driving an associated external device, a saturable reactor operatively associated with lines through which a current to be detected flows and provided with secondary and tertiary windings for detecting said current to be detected, a multivibrator circuit connected to said saturable reactor responsive to the value of the current to be detected and providing two outputs, a pair of duty detecting circuits respectively receiving each of said two outputs of said multivibrator circuit, a level discriminating circuit for discriminating level difference between outputs of said duty detecting circuits and energizing said operating circuit when said level difference exceeds a predetermined discrimination level, and a high frequency oscillation detecting circuit connected to the duty detecting circuits independently of said level discriminating circuit for detecting the oscillation of the saturable reactor and energizing the operating circuit.

2. A device according to claim 1 wherein said high frequency oscillation detecting circuit is provided in a pair which are connected respectively to each of said duty detecting circuits.

3. A device according to claim 1 which further comprises a voltage detecting circuit connected to said power circuit independently of said level discriminating circuit and high frequency oscillation detecting circuit for energizing said operating circuit upon any abnormal state.

4. A device according to claim 1 wherein said multivibrator circuit includes a resistance for detecting said current to be detected.

5. A device according to claim 1 wherein a differential amplifying circuit is connected between said duty detecting circuits and said level discriminating circuit.

6. A device according to claim 1 wherein said level discriminating circuit includes a full-wave rectification circuit and a time delay circuit.

7. A device according to claim 3 wherein said voltage detecting circuit includes a voltage amplifying circuit, a full-wave rectification circuit and a time delay circuit.

* * * * *